United States Patent
Tamba et al.

[11] Patent Number: 5,258,644
[45] Date of Patent: Nov. 2, 1993

[54] SEMICONDUCTOR DEVICE AND METHOD OF MANUFACTURE THEREOF

[75] Inventors: Akihiro Tamba, Hitachi; Yutaka Kobayashi, Katsuta; Tetsurou Matsumoto, Higashiyamato, all of Japan

[73] Assignee: Hitachi, Ltd., Tokyo, Japan

[21] Appl. No.: 918,133

[22] Filed: Jul. 23, 1992

Related U.S. Application Data

[63] Continuation of Ser. No. 313,858, Feb. 23, 1989, abandoned.

[30] Foreign Application Priority Data

Feb. 24, 1988 [JP] Japan .................................. 63-39445

[51] Int. Cl.$^5$ ............................................. H01L 29/00
[52] U.S. Cl. .................................... 257/561; 257/560; 257/586; 257/588
[58] Field of Search ................... 357/34, 35, 56, 43, 357/23.4; 257/574, 560, 561, 586, 588, 592

[56] References Cited

U.S. PATENT DOCUMENTS

| | | | |
|---|---|---|---|
| 4,259,680 | 3/1981 | Lepselter et al. | 357/35 |
| 4,510,676 | 4/1985 | Anantha et al. | 357/35 |
| 4,586,968 | 5/1986 | Coello-Vera | 357/35 |
| 4,602,267 | 7/1986 | Shirato | 357/35 |
| 4,799,098 | 1/1989 | Ikeda et al. | 357/43 |
| 4,806,499 | 2/1989 | Shinohara | 357/43 |
| 4,829,356 | 5/1989 | Arndt | 357/35 |
| 4,839,305 | 6/1989 | Brighton | 357/34 |
| 4,985,367 | 1/1991 | Takada | 357/35 |

FOREIGN PATENT DOCUMENTS

| | | | |
|---|---|---|---|
| 0137992 | 4/1985 | European Pat. Off. | 357/35 |
| 56-62361 | 5/1981 | Japan | 357/35 |
| 59-181060 | 10/1984 | Japan | 357/35 |
| 61-236153 | 10/1986 | Japan | 357/43 |
| 62-293768 | 12/1987 | Japan . | |

*Primary Examiner*—Jerome Jackson
*Assistant Examiner*—Hung X. Dang
*Attorney, Agent, or Firm*—Antonelli, Terry, Stout & Kraus

[57] ABSTRACT

An improved bipolar transistor is provided which can be formed using a number of process steps which are similar to those used for forming MOSFETs. As such, the bipolar transistor is particularly useful in BiCMOS device arrangements. In accordance with one embodiment, a bipolar transistor is formed so that at least one of the emitter and collector regions has a high impurity region and a low impurity region. The collector and emitter regions of the device are formed in the base region to be spaced apart from one another, and the base electrode is arranged to cover the area of the base region between them. In an alternative embodiment, two collector regions can be provided in a base region on opposite sides of an emitter which is also formed in the base region. Two base electrodes can then be respectively provided in the areas between the two collectors and the emitter region. The bipolar transistors are particularly useful for forming a horizontal bipolar transistor structure. Because the bipolar transistors can be formed using the same types of steps used in the manufacture of MOSFETs, the manufacturing costs of the device can be reduced without sacrificing operational capabilities. This is particularly true in the manufacture of BiCMOS devices because many simultaneous manufacturing steps can be used for manufacturing the bipolar transistors and the MOSFETs.

11 Claims, 10 Drawing Sheets p+ ION IMPLANTATION
B+, 13KeV
$3 \times 10^{15}/cm^2$ n+ ION IMPLANTATION
As+, 80KeV
$5 \times 10^{15}/cm^2$

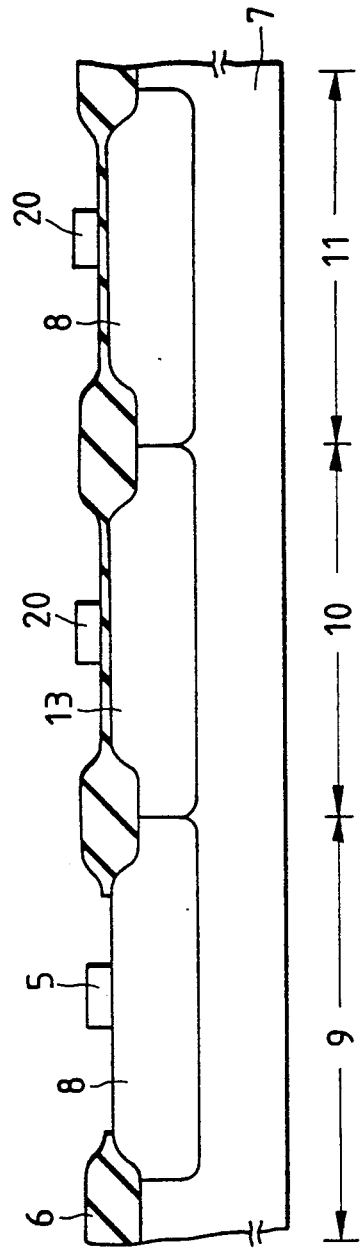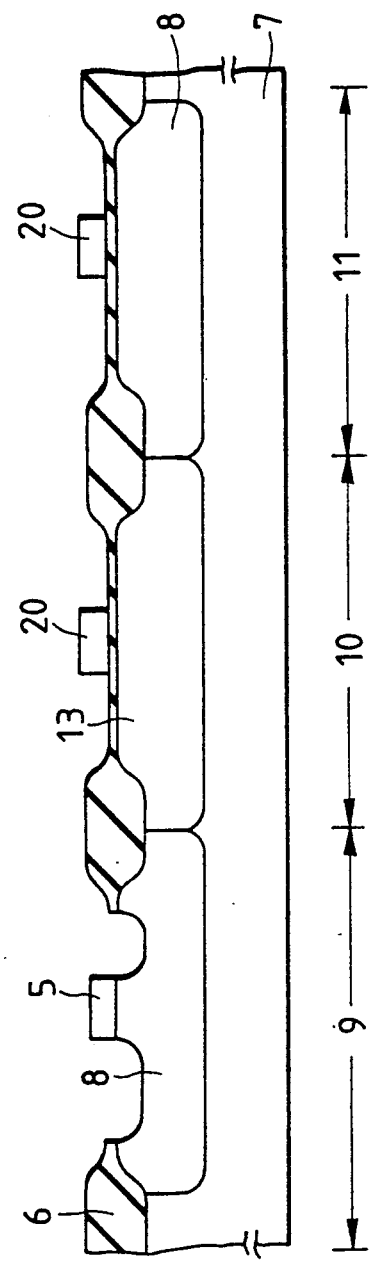

SEMICONDUCTOR DEVICE AND METHOD OF MANUFACTURE THEREOF

This application is a continuation of application Ser. No. 313,858, filed on Feb. 23, 1989 now abandoned.

BACKGROUND OF THE INVENTION

This invention relates to the structure of a semiconductor device and the method of manufacture thereof and more particularly to the structure and fabrication method of a semiconductor device suitable for large-scale integrated circuits.

LSI circuits use semiconductor devices of various structures.

For instance, as disclosed in the Japanese Patent Application Laid-Open No. 255049/1986, bipolar transistors and MOSFETs (metal-oxide semi-conductor field-effect transistors) are formed on one and the same substrate to provide a BiCMOS LSI structure. The basic structure of the BiCMOS LSI is shown in FIG. 1, as applied to dynamic random access memory. In the figure, the bipolar transistor (simply referred to as a bipolar hereafter) forming the BiCMOS LSI is a vertical type and thus requires an n+ buried layer (in the npn bipolar). To form the n+ buried layer an epitaxial layer is grown.

In the above-mentioned conventional integrated circuits, forming the bipolar devices and the MOSFET devices requires an epitaxial process, which means reduction in the manufacturing time is difficult.

The conventional LSI circuits have no considerations as to sharing the manufacturing processes between the bipolar devices and the MOSFET devices.

Moreover, they incorporate no effective measures to increase the circuit density of LSI containing a combination of bipolar and MOSFET devices.

SUMMARY OF THE INVENTION

The object of this invention is to provide the structure of a semiconductor device which is suitable for reducing the number of manufacture processes and the method of manufacture thereof.

Another object of the invention is to provide the structure of a semiconductor device which is suitable for increasing the circuit density of integrated circuits formed of a combination of bipolar and MOSFET devices, and the method of manufacture thereof.

Still another object of the invention is to provide a novel structure of a bipolar device suitable for large scale integration and the method of manufacture thereof.

The above objectives can be achieved by making the structure of the bipolar device and its manufacture method similar to those of the MOSFET device.

That is, the bipolar device is given the structure of the MOSFET device with a least a part of the gate insulation film removed.

With the construction of the bipolar device made similar to that of the MOSFET device, it is possible to use manufacture processes similar to that of the MOSFET device in forming the bipolar device.

Therefore, in LSI circuits formed of a combination of bipolar devices and MOSFET devices, the common use of the manufacture processes for two kinds of devices can reduce the manufacturing time.

The common structures also allow application of a technique of reducing the size of MOSFET devices also to the horizontal bipolar devices, thus reducing the size of the latter.

Moreover, sicne the epitaxial process can be eliminated, further reduction in manufacturing time is possible.

The above and other features of this invention will become apparent from the following descriptions and attached drawings.

BRIEF DESCRIPTION OF THE DRAWINGS

FIGS. 7, 8A, 8B, 9, 10, 11A, 11B, 11C, 12, 13A, 13B and 15A-15E are cross-sectional views of devices as other embodiments of the invention.

DETAILED DESCRIPTION OF THE PREFERRED EMBODIMENTS

Figure 1:
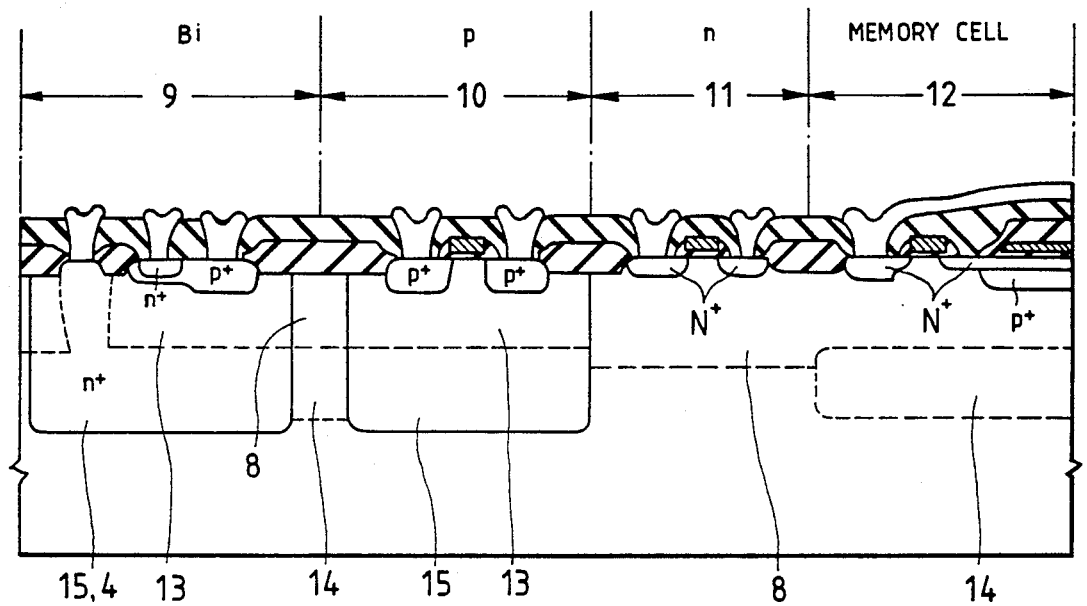
FIG. 1 is a cross-sectional view of the basic structure of a conventional BiCMOS DRAM.

Now, embodiments of this invention and their variations are described by referring to the attached drawings. Reference numerals used in the drawings represent the following parts: 1 . . . emitter, 2 . . . base, 3 . . . collector low concentration layer, 4 . . . collector high concentration layer, 5 . . . p+ polycrystal Si, 6 . . . SiO2 layer, 7 . . . n type Si substrate, 8 . . . PWELL, 9 . . . bipolar, 10 . . . p type MOSFET, 11 . . . n type MOSFET, 12 . . . memory cell, 13 . . . NWELL, 14 . . . p+ buried layer, 15 . . . n+ buried layer, 16 . . . polycrystal Si, 18 . . . external base region, 19 . . . buried p+ region, and 20 . . . n+ type polycrystal Si.

Figure 2:
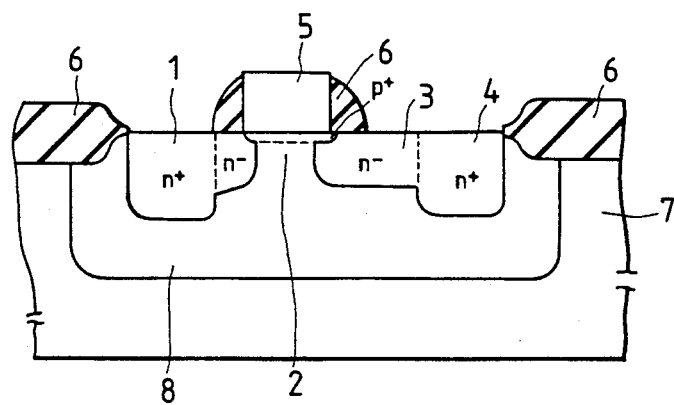
FIG. 2 is a cross-sectional view of the bipolar structure of this invention.

One example of a horizontal bipolar structure according to this invention is shown in FIG. 2. The horizontal bipolar of FIG. 2 has no n+ buried layer which is used as a collector in the conventional vertical bipolar devices. In addition, the horizontal bipolar has as many manufacturing processes as possible shared by MOSFET and bipolar devices. That is, the base region 2 of the bipolar device is formed by the PWELL implantation process which also forms a PWELL in an n type MOSFET. The emitter layer 1 and the collector high concentration layer 4 of the bipolar device are formed by the same process that forms the MOSFET source and drain. The collector low concentration layer 3 of the bipolar device is formed during the n− ion implantation process which is commonly used in forming the low concentration layer in the LDD structure of the n type MOSFET. As described above, the example structure of the npn bipolar according to this invention can have almost the same manufacture processes as those for the n type MOSFET, except that the n+ polycrystal Si, which forms a gate electrode in the n type MOSFET, is replaced with a p+ polycrystal Si 5 to eliminate an oxide film corresponding to the gate oxide film of the MOSFET.

Figure 15A:
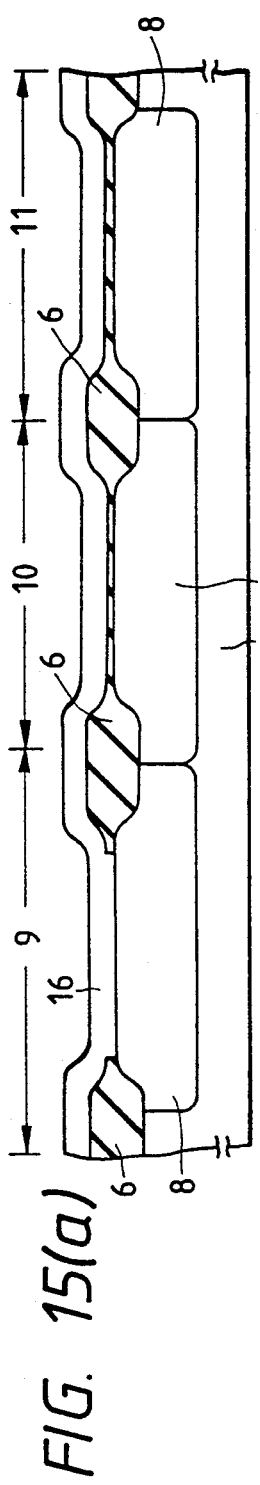
Figure 15B:
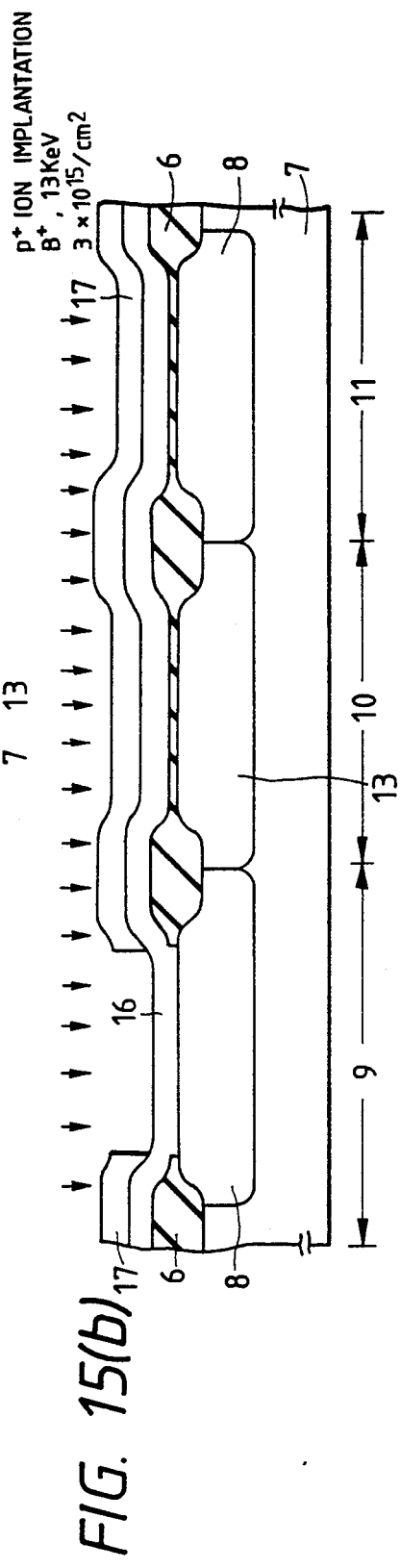
Figure 15C:
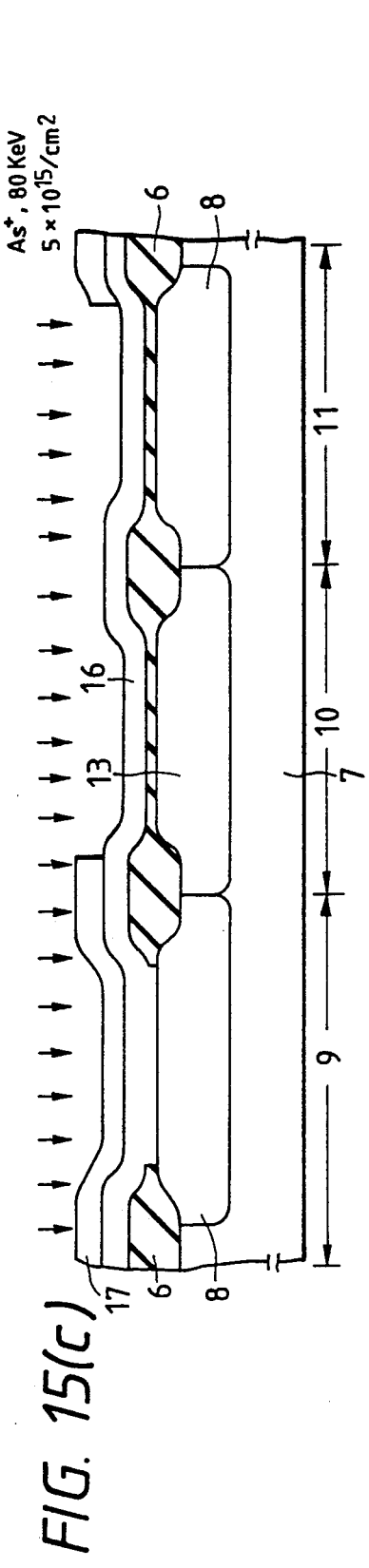

FIG. 15 shows the outline of processes for forming the bipolar of the invention simultaneously with the n type MOSFET and the p type MOSFET, up to the formation of the gate electrode polycrystal Si. As shown in FIG. 15(a), the SiO2 layer 6 is formed to separate the components and a polycrystal Si 16 is deposited over the entire surface. Then, a photoresist 17 is covered over the entire surface except where the bipolar 9 will be formed, and the substrate is implanted with p+ ion (B+, 13 KeV, $3 \times 10^{15}/cm^2$) (FIG. 15(b)). Next, the bipolar area is coated with photoresist 17 and the n+ ion implantation process (As+, 80 KeV, $5 \times 10^{15}/cm^2$) is performed (FIG. 15(c)). Then, simultaneously with the process of forming the MOSFET gate electrode, the base electrode of the bipolar 9 is formed (FIG. 15(d)). While in FIG. 15 the gate electrode polycrystal Si of p type MOSFET 10 is formed of n+ polycrystal SiO2, it may be formed of p+ polycrystal Si 5.

Figure 3:
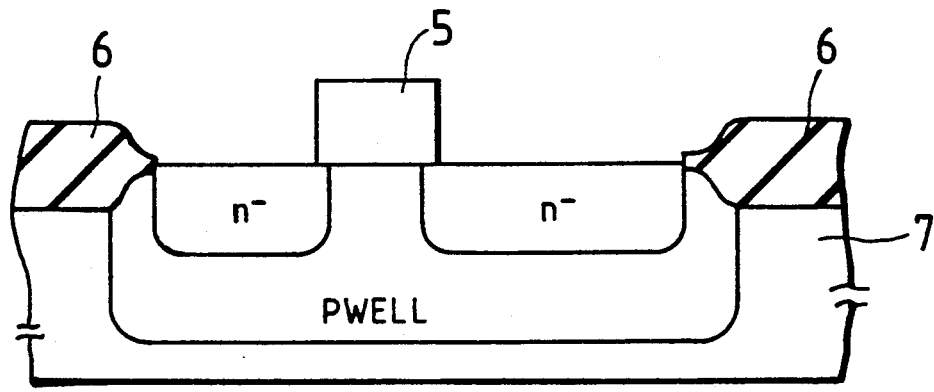
FIGS. 3A-3C shows an outline of process for manufacturing the structure of FIG. 2.
Figure 3:
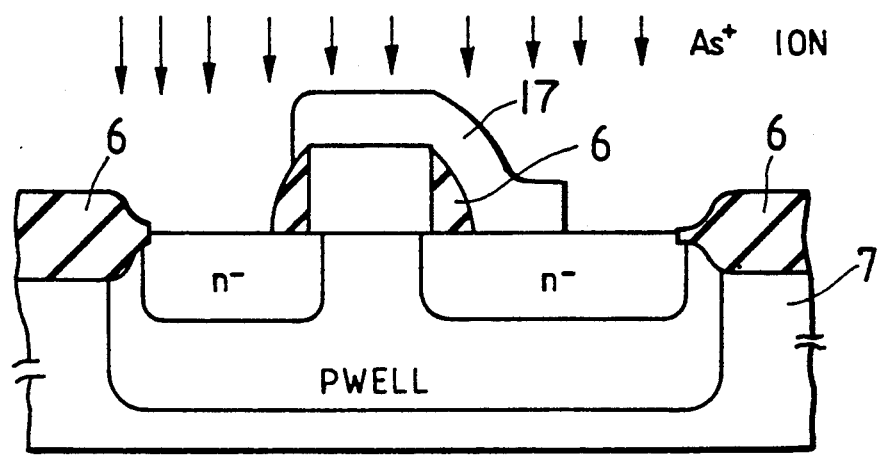
Figure 3:
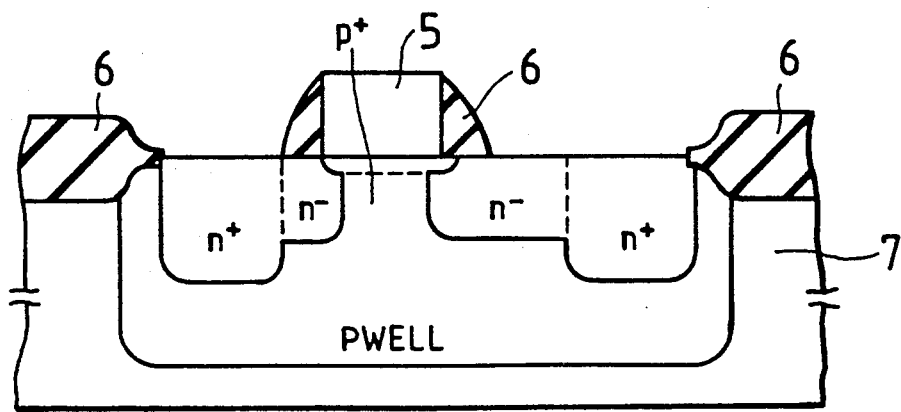

As shown in FIG. 15(e), while working on the gate electrode and base electrode polycrystal Si, it is possible to etch the substrate monocrystal Si and form recesses on each side of the base electrode to provide a bipolar structure. In this case, since the MOSFET region has the gate oxide film under the polycrystal Si 20, the substrate Si under this area is not etched away. The outline of the bipolar fabrication process after the base electrode is formed is shown in FIG. 3. The basic structure of the BiCMOS DRAM formed of npn bipolar of FIG. 2 is shown in FIG. 4.

In the process of FIG. 3, a p type well PWELL is formed surrounded by the SiO2 film 6 which is a LOCOS film. After this, an n− layer is formed by using the polycrystalline silicon film 5 as a mask, which is formed by the same process that is used in forming the gate electrode of MOSFET (not shown). Then, a side wall of SiO2 film 6 is formed around the polycrystalline silicon film 5. By using the photoresist 17 and the SiO2 film 6 as the mask, As+ ion is implanted into the substrate to form an n type high concentration layer.

Figure 4:
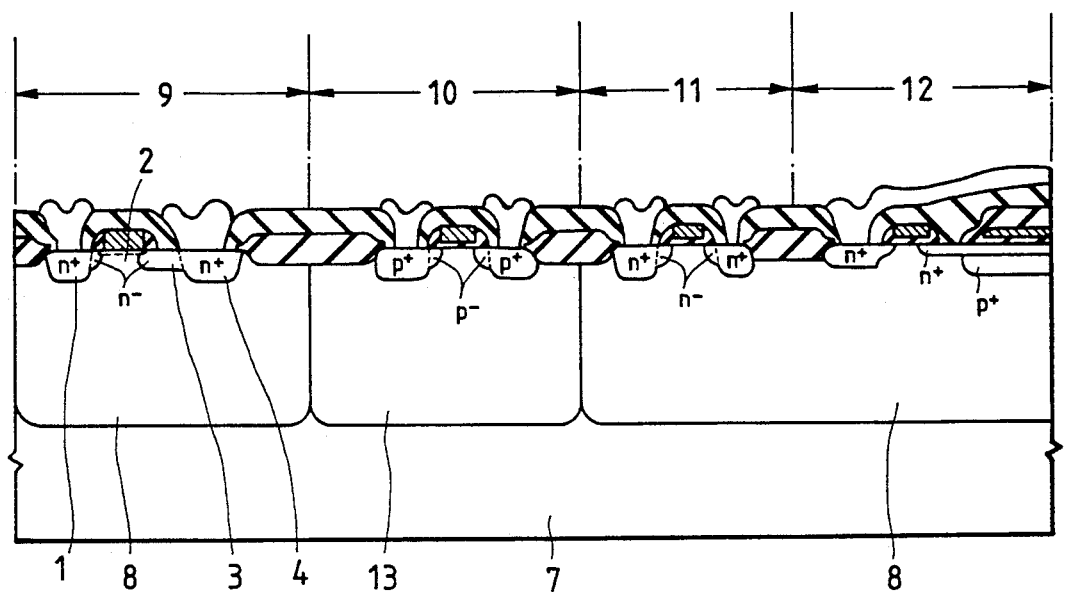
FIG. 4 is a cross-sectional view of the basic structure of the BiCMOS DRAM formed of bipolars of FIG. 2.

FIG. 4 shows a part of the cross section of the BiCMOS DRAM using the bipolar components of this invention. In the figure, the region indicated by reference numeral 9 is a bipolar region in which a bipolar device is formed in the PWELL 8 of a structure shown in FIGS. 2 or 3; the region indicated by 10 is a p type MOSFET formed in the NWELL 13; the region indicated by 11 is an n type MOSFET; and the region 12 is a memory cell made up of an n type MOSFET and a capacitor. The n type MOSFET region 11 and the memory cell 12 are formed in the same PWELL 8.

Comparison between the vertical bipolar device of FIG. 1 and the horizontal bipolar device of this invention shows their merits and demerits. The vertical bipolar device can be made very small because the widths of the emitter, base and collector can be controlled by ion implantation and thermal diffusion, allowing high speed operation of the bipolar device (higher $f_T$ (cut-off frequency) can be achieved). As to the demerit, since it draws collector currents, the vertical bipolar device requires an n+ buried layer (npn bipolar), raising the fabrication cost. Further, it has a device characteristic that the collector resistivity is relatively large. As to the horizontal bipolar device of this invention, since the main component of the collector current is parallel to the Si substrate surface, it does not require the n+ buried layer, reducing the manufacture cost. Another advantage is that the collector resistivity is small. However, the widths of the emitter, base and collector are determined by the photoresist mark dimensions and therefore cannot be made small compared with the vertical bipolar device. This makes it difficult to increase the operation speed. Particularly since the base width cannot be made smaller than the minimum dimension of the photoresist mask, an increase in $f_T$ has been considered very difficult.

Figure 5:
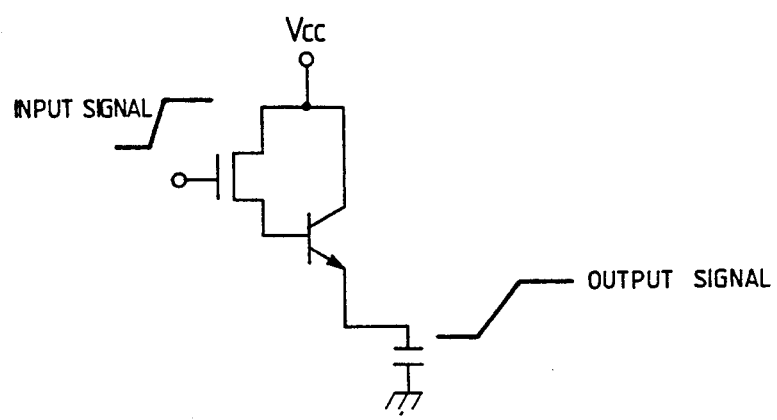
FIG. 5 shows a circuit to measure the delay time of the BiCMOS gate.

It has been believed that the operation speed of the BiCMOS LSI depends largely on $f_T$ of the bipolar device and that, when the bipolar device is formed as a horizontal type, the base width cannot be made small enough to increase $f_T$, resulting in a substantial reduction in the operation speed. However, examination of a delay time for one stage of BiCMOS gate circuit, as shown in FIG. 5, by changing the base width of the vertical bipolar device has found that the delay time does not increase for the base width of up to about 0.6 μm. This may be explained as follows. In the conventional method of estimating the dependence of BiCMOS gate of $f_T$ by simulation, the value of $f_T$ used is the one determined by the impurity concentration distribution (not the carrier distribution). Therefore, it has been considered that the smaller the base width which is determined by the impurity concentration distribution, the more the delay time will be reduced. In reality, however, the bipolar of the BiCMOS gate shows a transient operation, in which a large amount of carriers flows instantaneously and a strong Kirk (base push-out) effect results, making the effective width of the base significantly increase. Therefore, the delay time is considered to be not greatly dependent on the width of the base determined by the impurity concentration distribution.

As shown above, the base width of up to 0.3 μm can easily be achieved by the 0.5 μm process in the horizontal bipolar of this invention. As to the operation speed, the horizontal bipolar has no problem if it has the specified width of the base. Therefore, if the horizontal bipolar of this invention is used to form the BiCMOS gate, the CMOS process can be used, so that a BiCMOS LSI thus produced will have a cost comparable to that of CMOS and the operation speed higher than that of CMOS.

One example process of fabricating the horizontal bipolar transistor with a structure of FIGS. 2 and 3 by using the manufacture processes that are commonly used for the MOSFET components is explained in more detail with reference to FIG. 6.

Figure 6A:
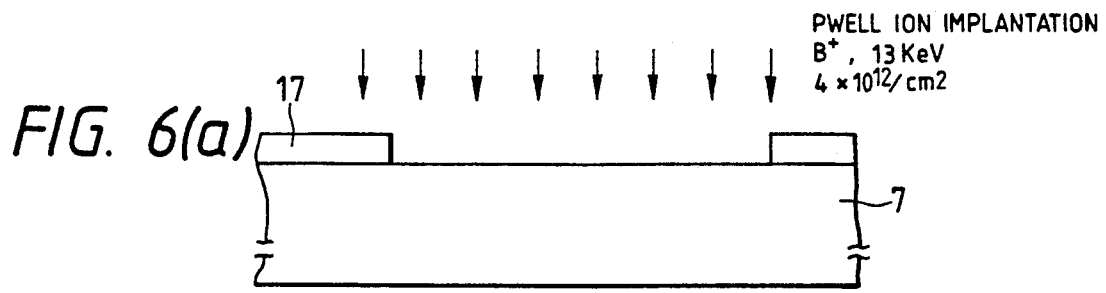
FIGS. 6A-6F shows a process of manufacturing the bipolar of FIG. 2.
Figure 6B:
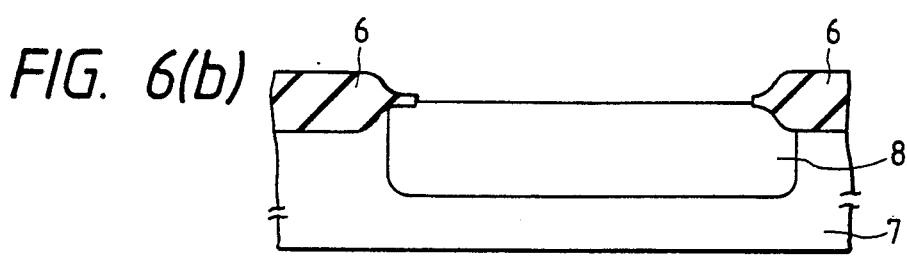
Figure 6C:
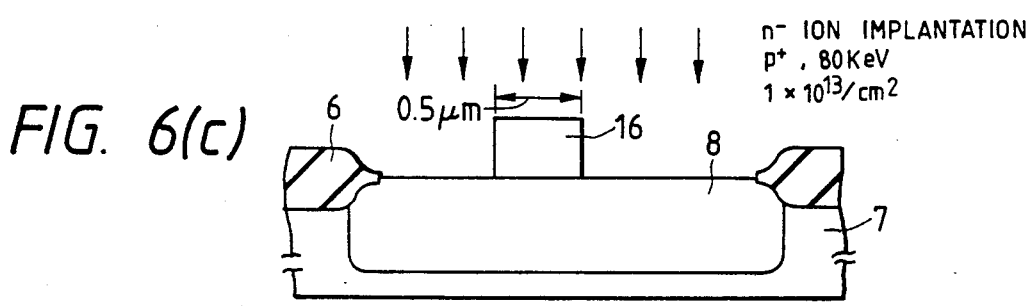
Figure 6D:
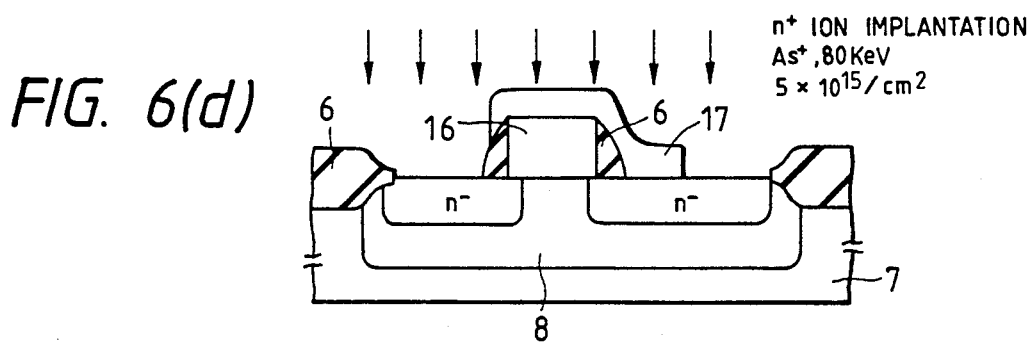
Figure 6E:
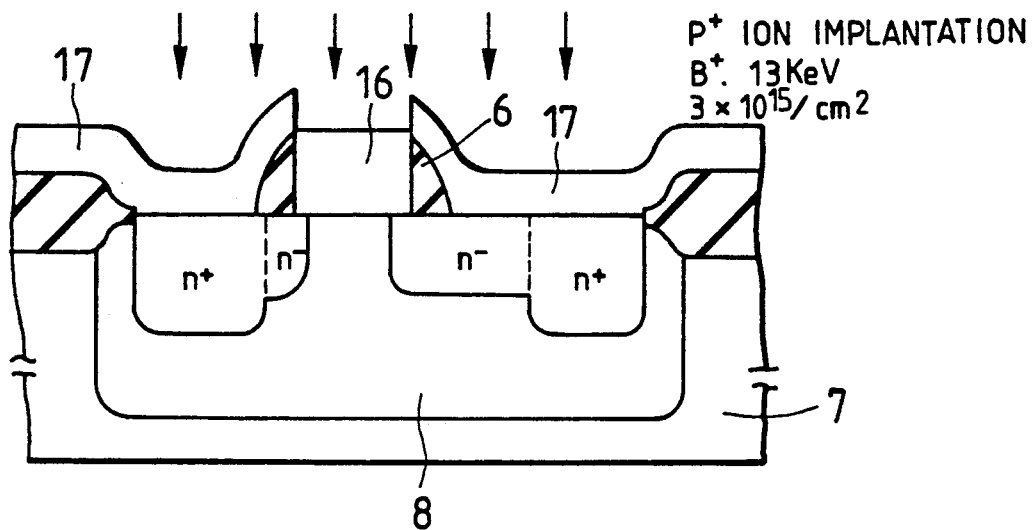
Figure 6F:
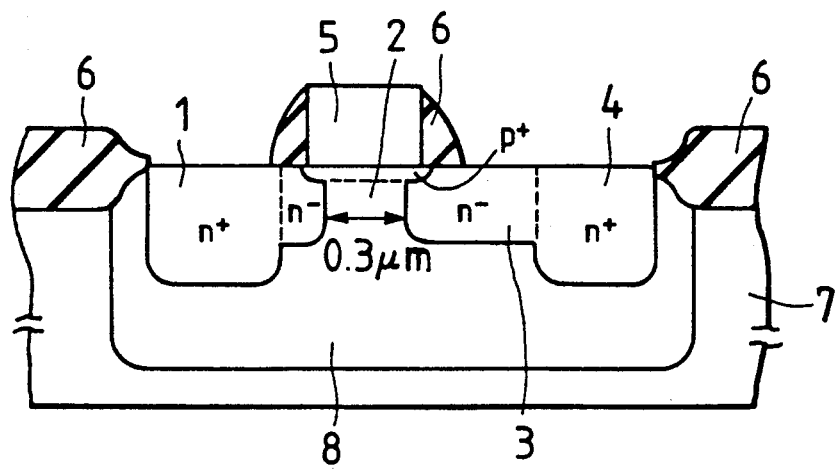

As shown in FIGS. 6(a) and (b), the n type Si substrate 7 is implanted with B+ ion (at an impinging energy of 13 keV and a dose of $4 \times 10^{12}/cm^2$) to form a PWELL 8 as the base formation region for the n type MOSFET. Then an SiO2 layer 6 is formed to separate components. Next, as shown in FIG. 6(c), a non-doped polycrystal Si is deposited to the thickness of 0.2 μm and the width of 0.5 μm by the same photolithography process that is used in forming the gate electrode in MOSFET. Then, the n− ion implantation (p+ ion is implanted at an impinging energy of 80 KeV and a dose of $1 \times 10^{13}/cm^2$), which is also used to form the LDD of the n type MOSFET, is performed to form a collector low concentration region. And as shown in FIG. 6(d), the polycrystal Si 16 and the area that will become the collector low concentration layer 3 are coated with photoresist 17, after which the n+ ion implantation (As+ ion is implanted at an impinging energy of 80 KeV and a dose of $5 \times 10^{15}/cm^2$), which is also used to form the source and drain of MOSFET, is carried out to form an emitter 1 and a collector high concentration layer 4. FIG. 6(e) represents the process of forming the p+ polycrystal Si to extract a base electrode. In this process, the entire surface is covered with photoresist 17 except at the polycrystal Si 16, followed by the p+ ion implantation (B+ ion is implanted with an impinging energy of 13 KeV and a dose of $3\times10^{15}/cm^2$). With the above process, a horizontal bipolar is obtained which has its base electrode formed of p+ type polycrystal Si 5, as shown in FIG. 6(f). It is seen from the figure that in the horizontal bipolar thus produced the minimum width of the base of 0.5 μm is reduced to 0.3 μm through the lateral expansion of impurity. Impurities from the p+ polycrystal Si 5 are diffused into a layer beneath it to transform the underlying layer into the p+ layer.

Figure 11A:
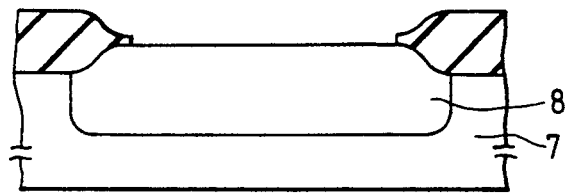
Figure 11B:
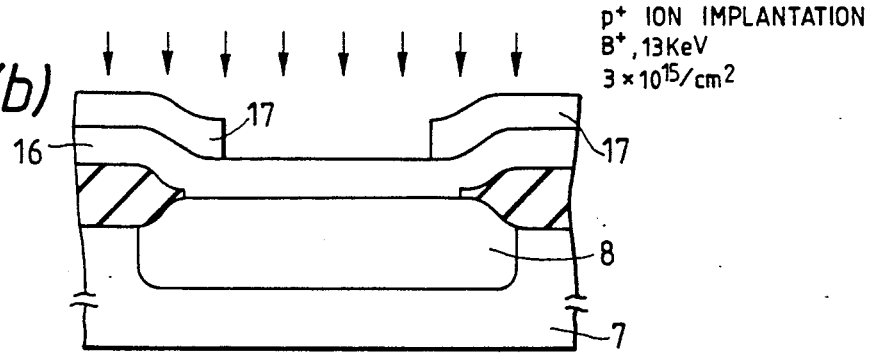
Figure 11C:
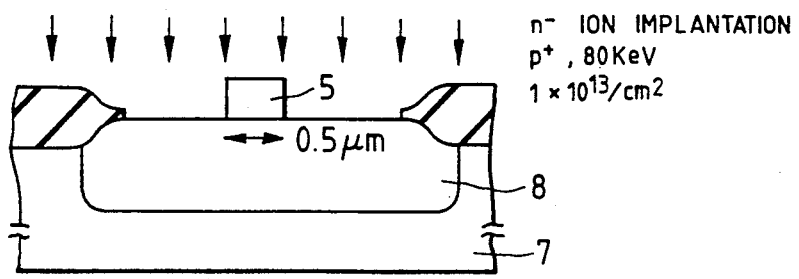

While, in the above process, the p+ ion implantation is performed at the last step, it may be carried out first. This is represented by the process of FIG. 11. That is, after the process corresponding to that of FIG. 6(b) (see FIG. 11(a)) is done, a polycrystal Si 16 is deposited and covered with photoresist 17 except at an area surrounding and including the portion of Si that will remain after being processed. The surface is then subjected to the p+ ion implantation (B+ ion is implanted at the impinging energy of 13 KeV and the dose of $3\times10^{15}/cm^2$) (FIG. 11(b)). After this, the p+ polycrystal Si 5 is processed and undergoes the n− ion implantation (p+ ion is implanted at the impinging energy of 80 KeV and the dose of $3\times10^{13}/cm^2$) (FIG. 11(c)).

In the above process the p+ polycrystal Si 5 is formed as a base electrode, after which the process of FIG. 6(d) is carried out and the process of FIG. 6(e) omitted, producing the complete device of FIG. 6(f). The delay time of the BiCMOS gate does not increase up to the base width of about 0.6 μm. In the BiCMOS LSI using the horizontal bipolar of the above embodiment, the access time is not large, when compared with the LSI using the conventional vertical bipolar (with the base width of about 0.2 μm). A 1M bit BiCMOS DRAM was manufactured using the horizontal bipolar and its access times was 25 ns, which is almost comparable to the access time of 24 ns for the DRAM using the conventional vertical bipolar with the base width of about 0.2 μm.

The n− layer in FIG. 6 is formed to extend the depletion layer at the junction of base and collector toward the collector side and thereby secure a sufficient dielectric strength.

Figure 7:
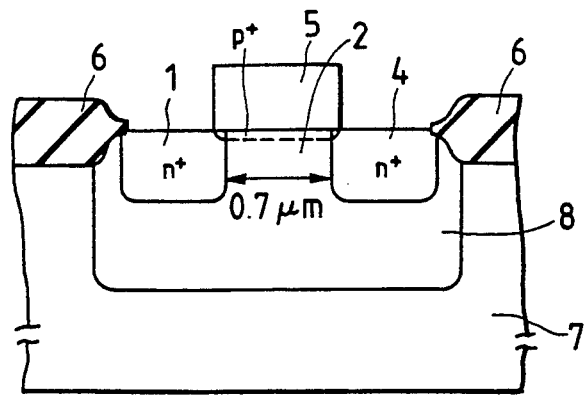

In addition to the structure shown in FIG. 6, various other horizontal bipolar structures are possible. FIG. 7 shows a construction of FIG. 2 with the n− layer removed. That is, the collector low concentration layer is not present but only the high concentration layer is formed. In this case, the base-collector junction depletion layer extends toward the base, so that the base width is increased to 0.7 μm to secure a sufficient dielectric strength. The absence of the n− layer allows the emitter injection efficiency to be increased.

Figure 8A:
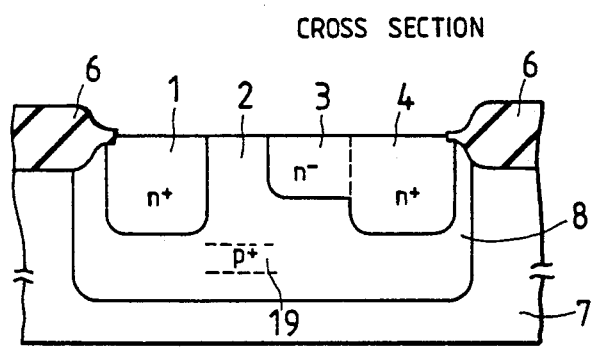
Figure 8B:
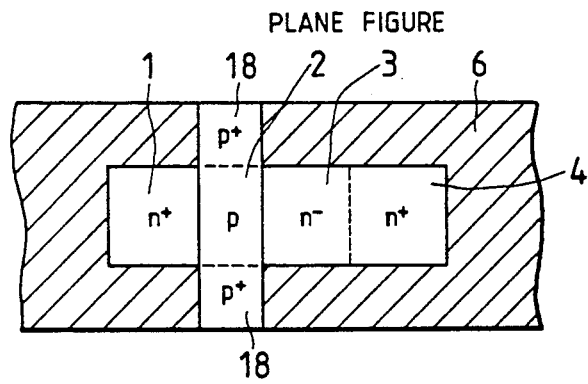

FIG. 8 shows another structure, in which a p+ external base region 18 instead of the p+ polycrystal Si is formed as the base electrode drawout layer, as shown in FIG. 8(b). The cross-sectional structure of the bipolar intrinsic region, as shown in FIG. 8(a), is similar to the one shown in FIG. 2 except that a buried p+ region 19 is formed to reduce the base resistance.

Figure 9:
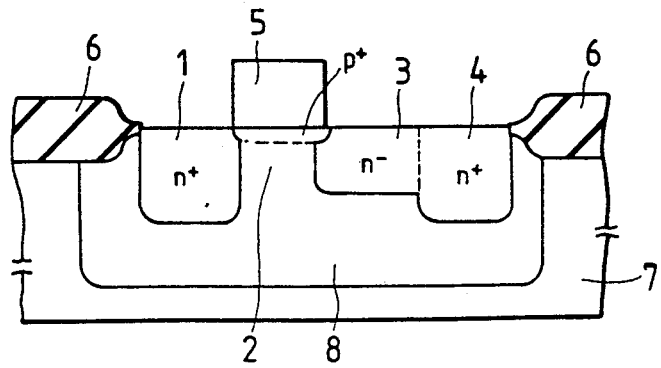
Figure 10:
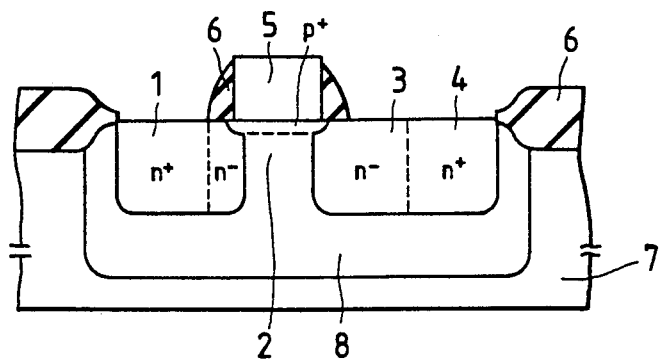

While in FIG. 7 the n+ regions on each side of the p+ polycrystal Si are eliminated, it is possible to remove the n− region only from the emitter side as shown in FIG. 9. In FIG. 6, the reason that the p+ region for drawing out the base is joined with the n− region of the emitter is to increase the dielectric strength between the base and the emitter and to reduce the base-emitter junction capacity. When these are not required, the structure of FIG. 9 may be used.

Furthermore, in the preceding examples the depth of the n− region is smaller than that of the n+ region. For improved bipolar characteristic, it is preferred that the depth of the n− region be made as large as possible so as to be almost equal to that of the n+ region.

Figure 12:
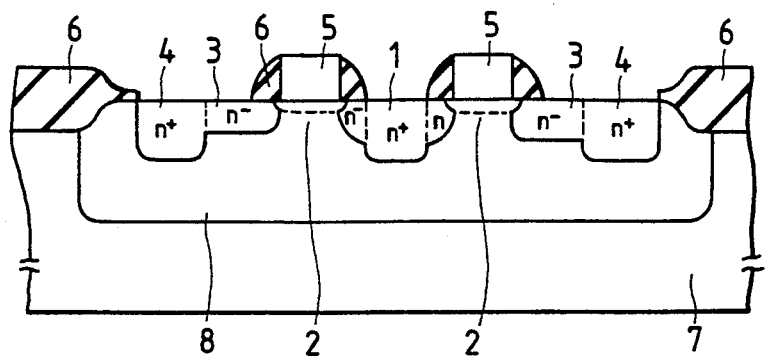

FIG. 12 shows a further example of the horizontal bipolar structure, in which base regions 2 and p+ polycrystal Si 5 are arranged on both sides of the emitter layer 1 and, on both sides farther away, collector high concentration layers 5 are formed. This is a double base, double collector bipolar structure. In this structure, the emitter can operate on both sides while in the preceding examples it operates on only one side (on the base electrode side). This will increase the current drive force.

Figure 13A:
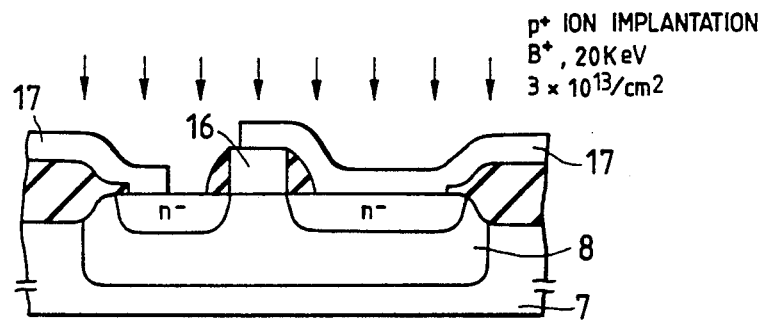
Figure 13B:
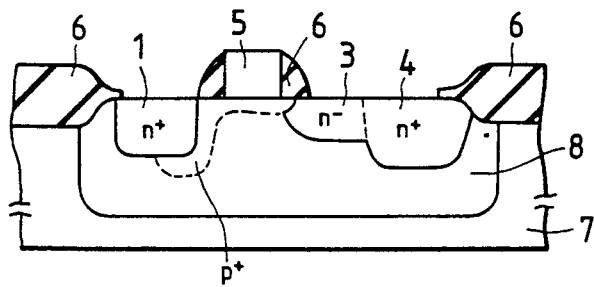

Next, in a bipolar structure shown in FIG. 13 the base region on the side of the emitter 1 is made higher in concentration than the PWELL, as shown in FIG. 13(b). This structure is formed, after the process of FIG. 6(d), by covering the surface with photoresist 17 except for the emitter region 1 on the base side and performing the p+ ion implantation (B+ ion is implanted at an impinging energy of 20 KeV and a dose of $3\times10^{13}/cm^2$), as shown in FIG. 13(a). The B+ ions injected into the emitter region have a greater diffusion constant than As, so that the structure obtained will be as shown in FIG. 13(b). The example of FIG. 13 is a variation of the structure of FIG. 6. The structure in which the p+ region is formed in the base on the emitter side is also applicable to the examples of FIGS. 7, 8, 9, 10 and 12.

Figure 14:
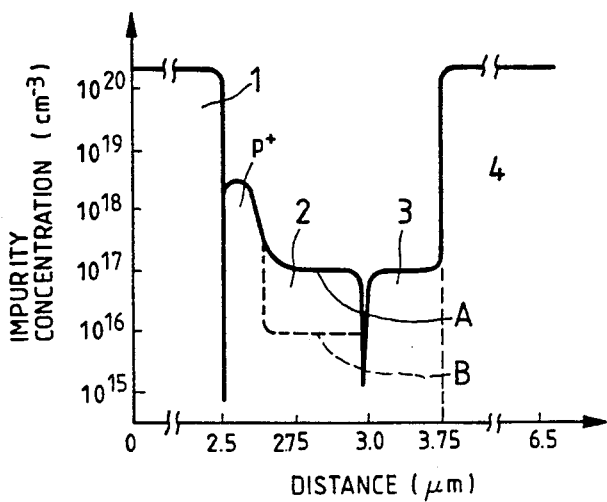
FIG. 14 is a diagram showing an impurity concentration distribution of the device of FIG. 13.

The impurity concentrations in the emitter, base and collector for the above two cases are shown in FIG. 14. First, as to the impurity concentration represented by A in FIG. 14, the concentration at base or PWELL is about $1\times10^{17}/cm^3$. The object of forming the p+ region is to give a gradient to the impurity concentration of the base to form a drift type transistor. Next, another impurity concentration of the base as indicated by B is approximately $1\times10^{16}/cm^3$. In the latter case the region with impurity concentration of about $1\times10^{16}/cm^3$ is depleted of mobile carriers and the region acting as a base (i.e., a neutral base region) is made up of only the p+ layer on the emitter side, which is about 0.1 μm. In such impurity distribution, the maximum cut-off frequency $f_{Tmax}$ is about 10 GHz, which means that this impurity concentration can be used for the ECL gate region where the $f_T$ is a determining factor the operation speed. Thus, the advantage of the impurity concentration distribution of a curve B is its ability to increase the cut-off frequency $f_T$ so that the device can be used in the gate circuit which is operated with small signals.

In the example of FIG. 6 the base width is set to 0.3 μm. But with the above impurity concentration, the width of the base need only be smaller than 0.6 μm. To prevent occurrence of punch-through in the base, the base width must be greater than 0.5 μm. From these considerations, the width of the base is preferably 0.5 to 0.6 μm.

While the above descriptions are concerned with npn bipolar devices, the same also applies to the pnp bipolar devices.

Formation of the n+ buried layer in the Si substrate requires ten process steps, which accounts for about 10 percent of approximately 100 steps for fabricating the BiCMOS DRAM. The CMOS DRAM requires about 90 steps. Thus, whether the n+ buried layer is formed or not is an important factor in determining the cost of these DRAMs. As shown in the above examples, this invention can also be applied to BiCMOS TTLs.

This invention permits simplifying the manufacture process for circuits formed of a combination of bipolar components and MOSFETs. That is, because the n+ buried layer is not needed, it is possible to eliminate the above-mentioned 10 process steps substantially reducing the cost of the BiCMOS LSIs.

As shown in the above examples, sicne the bipolar device is the MOS type bipolar device in which the gate isolation film of the n type MOSFET is removed and the n+ polycrystalline silicon is replaced with the p+ polycrystalline silicon, there is an advantage that the bipolar manufacture process and the MOS manufacture process can be commonly used to the maximum extent. The p+ polycrystalline silicon may be replaced with a composite silicide film containing p+ polycrystalline silicon. When a metal is to be directly connected with silicon, it may be joined with p type silicon through ohmic junction.

Although in the above examples the BiCMOS LSI has been described as applied only to the DRAM as shown in FIG. 4, it is apparent that this invention is effective for all LSIs which are formed of combined bipolar and MOSFET on the same chip, such as BiCMOS SRAM and BiCMOS logic.

This invention is applicable to an LSL having bipolar transistors operated in saturation state, like a TTL, even if it does not include MOSFETs.

What is claimed is:

1. A bipolar transistor formed in a semiconductor substrate comprising:
   a base region of a first conductivity type formed at a first major surface of said semiconductor substrate;
   an emitter region of a second conductivity type formed in said base region;
   a first collector region of the second conductivity type formed in said base region;
   a second collector region of the second conductivity type formed in said base region;
   a first base electrode coupled to said base region at a first portion of said base region exposed at said first major surface of said semiconductor substrate to cover at least a portion of said base region between said emitter region and said first collector region; and
   a second base electrode coupled to said base region at a second portion of said base region exposed at said first major surface of said semiconductor substrate to cover at least a portion of said base region between said emitter region and said second collector region.

2. A bipolar transistor according to claim 1, wherein said base electrode and said second base electrode include a polycrystalline semiconductor.

3. A bipolar transistor according to claim 1, wherein the first conductivity type is p-type and the second conductivity type is n-type.

4. A bipolar transistor according to claim 1, wherein said bipolar transistor further comprises:
   a first base high concentration region of the first conductivity type formed at said first portion of said base region exposed at said first major surface of said semiconductor substrate, and having a higher impurity concentration than an impurity concentration of said base region; and
   a second base high concentration region of the first conductivity type formed at said second portion of said base region exposed at said first major surface of said semiconductor substrate, and having a higher impurity concentration than an impurity concentration of said base region.

5. A bipolar transistor according to claim 1, wherein said semiconductor substrate includes at least one MOSFET.

6. A bipolar transistor according to claim 1, wherein the first collector region includes a first collector portion and a second collector portion, wherein the second collector portion has a lower impurity concentration than an impurity concentration of said first collector portion and is formed between said first collector portion and said first base electrode, and wherein said second collector region includes a third collector portion and a fourth collector portion, wherein said fourth collector portion has a lower impurity concentration than an impurity concentration of said third collector portion and is formed between said third collector portion and said second base electrode.

7. A bipolar transistor according to claim 6, wherein said emitter region, and said first, second, third and fourth collector portions are all exposed to said first major surface of said substrate so that said bipolar transistor comprises a horizontal bipolar transistor.

8. A bipolar transistor according to claim 7, wherein said bipolar transistor further comprises:
   a first base high concentration region of the first conductivity type formed at said first portion of said base region exposed at said first major surface of said semiconductor substrate, and having a higher impurity concentration than an impurity concentration of said base region; and
   a second base high concentration region of the first conductivity type formed at said second portion of said base region exposed at said first major surface of said semiconductor substrate, and having a higher impurity concentration than an impurity concentration of said base region.

9. A bipolar transistor according to claim 6, wherein said emitter region includes a first emitter portion, a second emitter portion and a third emitter portion, wherein said first emitter portion is formed between said second and third emitter portions, and wherein said first emitter portion has a higher impurity concentration than said second and third emitter portions.

10. A bipolar transistor according to claim 1, wherein said emitter region, and said first and second collector regions are all exposed to said first major surface of said substrate so that said bipolar transistor comprises a horizontal bipolar transistor.

11. A bipolar transistor formed in a semiconductor substrate comprising:
    a base region of a first conductivity type formed at a first major surface of said semiconductor substrate;
    an emitter region of a second conductivity type formed in said base region;
    a first collector region of the second conductivity type formed in said base region;
    a second collector region of the second conductivity type formed in said base region;
    a first base electrode coupled to said base region at a first portion of said base region exposed at said first major surface of said semiconductor substrate to cover at least a portion of said base region between said emitter region and said first collector region; and a second base electrode coupled to said base region at a second portion of said base region exposed at said first major surface of said semiconductor substrate to cover at least a portion of said base region between said emitter region and said second collector region;

wherein the first collector region includes a first collector portion and a second collector portion, wherein the second collector portion has a lower impurity concentration than an impurity concentration of said first collector portion and is formed between said first collector portion and said first base electrode, and wherein said second collector region includes a third collector portion and a fourth collector portion, wherein said fourth collector portion has a lower impurity concentration than an impurity concentration of said third collector portion and is formed between said third collector portion and said second base electrode;

wherein said emitter region, and said first, second, third and fourth collector portions are all exposed to said first major surface of said substrate so that said bipolar transistor comprises a horizontal bipolar transistor;

wherein said bipolar transistor further comprises:

a first base high concentration region of the first conductivity type formed at said first portion of said base region exposed at said first major surface of said semiconductor substrate, and having a higher impurity concentration than an impurity concentration of said base region; and a second base high concentration region of the conductivity type formed at said second portion of said base region exposed at said first major surface of said semiconductor substrate, and having a higher impurity concentration than an impurity concentration of said base region, wherein said emitter region includes a first emitter portion, a second emitter portion and a third emitter portion, wherein said first emitter portion is formed between said second and third emitter portions, and wherein said first emitter portion has a higher impurity concentration than said second and third emitter portions.

* * * * *